June 23, 1970 R. S. MARSHALL ET AL 3,517,352

VOLTAGE VARIABLE CAPACITANCE TUNED CIRCUIT HAVING DIODE MEANS COUPLED TO EACH TERMINAL OF THE APPLIED INPUT TUNING VOLTAGE

Filed Aug. 1, 1968

3,517,352
Patented June 23, 1970

3,517,352

VOLTAGE VARIABLE CAPACITANCE TUNED CIRCUIT HAVING DIODE MEANS COUPLED TO EACH TERMINAL OF THE APPLIED INPUT TUNING VOLTAGE

Richard S. Marshall and Allan S. Summers, Ilford, Essex, England, assignors to The Plessey Company Limited, Ilford, England Filed Aug. 1, 1968, Ser. No. 749,427
Claims priority, application Great Britain, Aug. 14, 1967, 37,289/67
Int. Cl. H03h *5/12;* H03j *5/24*
U.S. Cl. 334—15 8 Claims

ABSTRACT OF THE DISCLOSURE

In or for a tuned circuit arrangement having a tuned circuit incorporating a voltage variable capacitor as the tuning element for tuning the tuned circuit in dependence upon an applied tuning voltage, a tracking network comprising potential divider means having associated with it junction potential balancing means for producing an output voltage from the potential divider which is dependent upon the applied tuning voltage, said output voltage having an amplitude component which is independent of the potential divider ratio and substantially equal to the junction potential of said voltage variable capacitor.

Figure 1:
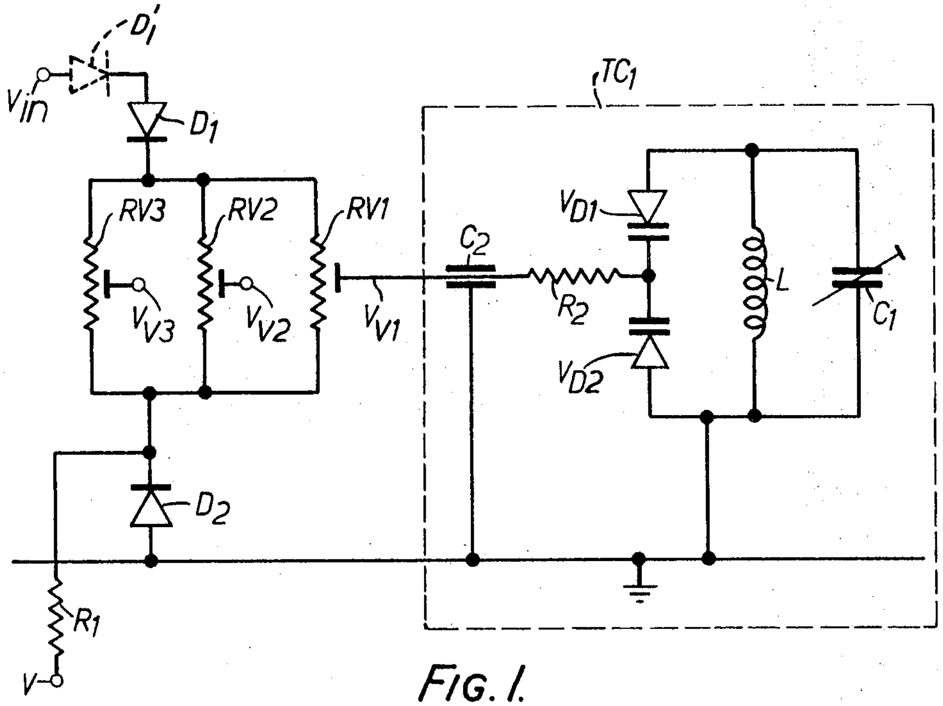

This invention relates to tuned circuit arrangements and relates more specifically to tuned circuit arrangements in which one or more of the tuning elements takes the form of a voltage variable capacitor such as a varactor diode.

In some applications it is very often required that a number of tuned circuits be tuned simultaneously or for a number of tuned circuits to be "tracked" to follow a predetermined law and for this to be done efficiently it is necesary to provide some means of tracking whereby differences in the tuned circuits can be equalised. It is common practice in such applications for the tuned circuits to comprise a variable inductance and a shunt trimmer capacitor whereby some degree of tracking is achieved. At U.H.F. the provision of a variable (high Q) inductance is not practicable and conventional tracking techniques cannot be used.

It is an object of the present invention to provide a tracking network for use with tuned circuits using voltage variable capacitors, whereby the need to provide a variable inductance is avoided but which achieves tracking which is comparable to that obtained with a variable inductance.

According to the present invention there is provided in or for a tuned circuit arrangement having a tuned circuit incorporating a voltage variable capacitor as the tuning element for tuning the tuned circuit in dependence upon an applied tuning voltage, a tracking network comprising potential divider means, junction potential balancing means associated with the potential divider means for producing an output voltage which is dependent upon the applied tuning voltage, said output voltage having an amplitude component which is substantially independent of the ratio of the potential divider means and substantially equal to the junction potential of said voltage variable capacitor.

In carrying out the invention the voltage variable capacitor of the tuned circuit may take the form of one or more varactor diodes in which case the junction potential balancing means may take the form of diode means connected in series with each end of a potential divider, the applied tuning voltage being applied across the free ends of the diode means.

In the case where two or more tuned circuits are to be tuned in dependence upon the applied tuning voltage, the tracking network may comprise a plurality of parallel connected potential dividers, each potential divider being associated with a tuned circuit for tracking purposes.

In one arrangement according to the present invention it may be arranged that the diode means take the form of a single diode connected in series with each end of the potential divider or dividers, with one diode being arranged to be forward biased by means of the applied tuning voltage and the other diode being arranged to be forward biased by means of an external voltage applied via a bleed resistor. Alternatively it may be arranged that the diode means takes the form of two series connected diodes connected in series with one end of the potential divider or dividers with a single diode connected in series with the other end of the potential divider, the said two diodes being arranged to be forward biased by means of the applied tuning voltage and the said single diode being arranged to be forward biased by means of an external voltage applied via a bleed resistor.

In a further arrangement according to the present invention there may be provided an offset voltage in series with the applied tuning voltage for changing the effective range of the applied tuning voltage and this offset voltage may be provided by means of a Zener diode connected in series with the diode or diodes which are forward biased by means of the applied tuning voltage or alternatively the offset voltage may be provided by means of a resistance connected in series with said diode or diodes the voltage developed across said resistance being dependent upon a reference voltage applied via a further resistance to the end of the potential divider to which the said diode or diodes is connected.

Figure 2:
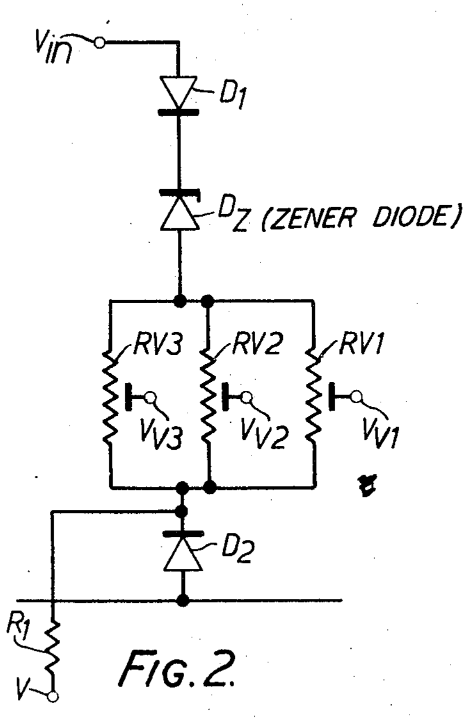
Figure 3:
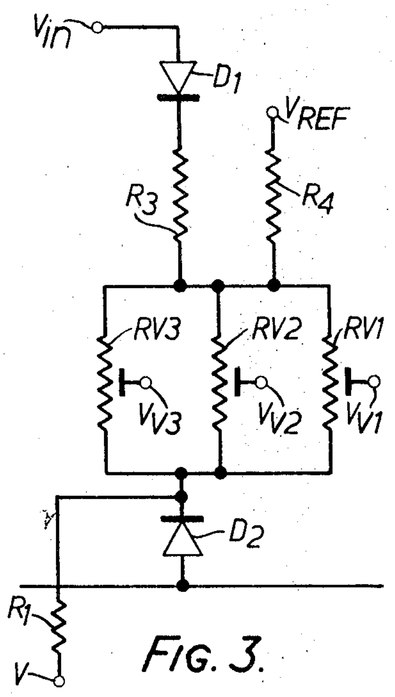

Some exemplary embodiments of the invention will now be described with reference to the accompanying drawing, in which FIG. 1 is a circuit diagram of a tuned circuit arrangement incorporating a tracking network according to the present invention;

FIG. 2 is a circuit diagram of a modified form of the tracking network of FIG. 1, and FIG. 3 is a circuit diagram showing a further modified form of the tracking network of FIG. 1.

A common form of voltage variable capacitor is a varactor diode. Now it can be shown that a varactor diode has a junction capacity which is given by:

$$Cj=\frac{K}{(V_b+\phi)^n}$$

where $Cj$ is the junction capacity in pico-farads

K is a constant (a function of the doping and dielectric constant of the material)

$V_b$ is the applied external bias voltage $\phi$ is the internal junction potential of the diode $n$ is a constant for a particular device ($\simeq 0.5$ for abrupt junction devices).

Tracking networks are necessary when more than one tuned circuit is used to achieve the following:

(1) Adjustment for variations of K from one diode to the next (typically $\pm 10\%$)

(2) Adjustment for variation of $n$ from one diode to the next (typically $\pm 3\%$)

(3) Adjustment for variations of $\phi$ from one diode to the next (typically $\pm 5\%$)

(4) Compensation for temperature changes in $\phi$ (typically 2–3 $M^V/°$ C.)

(5) Compensation for temperature changes in K (typically +75 p.p.m./° C.), and hence (6) Adjustment of the tuning curve to a single fixed "master curve."

In practice, unless the application requires very close tracking, functions (3) and (5) above are neglected so that a two-point tracking procedure may be used with a single temperature compensating circuit for changes in $\theta$.

In known tracking arrangements, variations in K are allowed for by varying the inductance of the tuned circuit, variations in $n$ are allowed for by varying a shunt trimmer capacitor and $\theta$ temperature variations are compensated for by using a forward biased diode.

Turning now to FIG. 1, there is shown a tracking arrangement for three tuned circuits, only one of which TC*l*, is shown in detail. The tuned circuit TC*l* comprises a fixed inductance L which has in parallel with it a trimmer capacitor $C_1$ and two varactor diodes $V_{D1}$ and $V_{D2}$ in back-to-back configuration. The bias voltage $V_{V1}$ for the varactor diodes $V_{D1}$ and $D_{D2}$ is fed via a feed through capacitor $C_2$ and an R.F. stopper resistor or choke $R_2$ to the junction of the two diodes. The tracking network consists of three potential dividers $RV_1$, $RV_2$ and $RV_3$ connected in parallel with diodes $D_1$ and $D_2$ connected one at each end across an input tuning voltage VIN. In order to forward bias the diode $D_2$ a negative voltage V is applied to it via a bleed resistor $R_1$.

In this circuit arrangement variations in $n$ are accounted for by adjustment of the trimmer capacitor $C_1$ and variations in K are accounted for by varying $RV_1$. In order that tracking is achieved which is as good as inductance tracking, it is necessary for the contact potential $\theta$ of the varactor diodes $V_{D1}$ and $V_{D2}$ to be "cancelled out." This is achieved by diodes $D_1$ and $D_2$ at each end of the potential dividers $RV_1$, $RV_2$ and $RV_3$. The voltage drop across each of the diodes $D_1$ and $D_2$ is arranged to be equal to the nominal $\theta$ of the varactor diodes $V_{D1}$ and $V_{D2}$. The operation of the circuit is best seen by considering that the input tuning voltage VIN is zero. Each end of the potentiometers $RV_1$, $RV_2$ and $RV_3$ is then at $-\theta$ volts and if no current is taken from the wipers of the potentiometers the varactor voltages $V_{V1}$, $V_{V2}$ and $V_{V3}$ at the wipers of the potentiometers will each be $-\theta$. That is, the voltages at the wipers are independent of the wiper position. Thus if the voltages across the diodes $D_1$ and $D_2$ are constant and have the correct temperature coefficient the contact potential $\theta$ will be cancalled out independent of temperature, tracking adjustment and input tuning voltage VIN. In practice the voltages across $D_1$ and $D_2$ will not be constant and in some cases their temperature coefficient will be lower than that of the varactor diodes $V_{D1}$ and $V_{D2}$, especially that of $D_1$ which tends to be low due to the fact that it draws very little current. The cancellation of $\theta$ in this case can be minimised by using a further diode $D_1$ in series with $D_1$. The cancellation of $\theta$ is then slightly dependent on the wiper position of the potential dividers but in most cases this is an acceptable limitation.

In some applications using varactor diodes it may be required that two groups of tuned circuits may be required to be tuned with different voltage ranges by the same input tuning voltage. In FIGS. 2 and 3 there are shown arrangements whereby this can be achieved.

In the tracking network of FIG. 1, it can be shown that the varactor voltage $V_{V1}$ is given by:

$$V_{V1}=aV_{IN}-\theta$$

where $\alpha$ is the potentiometer ratio of $RV_1$.

In FIG. 2 there is shown an arrangement whereby the input tuning voltage VIN is offset by an amount equal to the voltage of a Zener diode $D_Z$ placed in series with the diode $D_1$. In this case the varactor tuning voltage $V_{V1}$ is given by:

$$V_{V1}=a(V_{IN}+b)-\theta$$

where $+b$ is the voltage drop across the Zener diode $D_Z$.

Since the voltage drop across the Zener diode $D_Z$ is always negative, the varactor voltages $V_{V1}$, $V_{V2}$ and $V_{V3}$ will be less than the input tuning voltage VIN. In order to arrange that the varactor voltages $V_{V1}$, $V_{V2}$ and $V_{V3}$ may be greater or less than the input tuning voltage VIN as may be required in some cases, the circuit of FIG. 3 has been modified so that the value $b$ (corresponding to the voltage across the Zener diode $D_Z$ of FIG. 2) may be either positive or negative. This is achieved by replacing the Zener diode $D_2$ with a resistor $R_3$ and providing a reference voltage $V_{REF}$ in series with a further resistor $R_4$ as shown. It can be shown that the effective voltage $b$ across the reistor $R_3$ is given by:

$$b=V_{REF}\left(\frac{R_3{}^1}{R_4}\right)$$

where $R_3{}^1=R_3+$source resistance of VIN and where $V_{REF}$ may be positive or negative as required. It will be seen that the value of $b$ is independent of $RV_1$, $RV_2$ and $RV_3$.

The circuit arrangements hereinbefore described enable two or more tuned circuits to be tuned together with a tracking accuracy equal to that of inductance tracking but without the need to provide a variable inductance. The arrangement of FIG. 1 together with either the arrangement of FIG. 2 or FIG. 3 also enables two groups of tuned circuits to be tuned over different frequency ranges with the same input tuning voltage. In addition to the above the circuits described achieve temperature compensation which is independent of tracking adjustments; earthed inductors (essential for back-to-back varactors) may be used; no blocking capacitors in the R.F. path are necessary; there is no interaction between tracking controls; the current drain of the networks do not vary with tracking adjustments; although potentiometers are used, comparatively high varactor leakage currents do not affect tracking, economy of components gives inherent reliability; except for potentiometer ratio, no component or parameter is critical to the success of the circuit; resistance tolerance, temperature drift and long term drift of the potentiometers are largely self-cancelling, and provided the ratio stays constant a non-precision component may be used and the input tuning voltage is defined relative to earth.

Minor modifications may be made to the circuit arrangements described without departing from the scope of the invention. For example in FIG. 1, two varactor diodes $V_{D1}$ and $V_{D2}$ have been used in back-to-back configuration to reduce distortion, de-tuning with large signals and cross-modulation but in many applications where these requirements are not so strict a single varactor diode tuned circuit may be used. This may be done, for example, simply by replacing either of the varactor diodes $V_{D1}$ and $V_{D2}$ with a fixed capacitor. The arrangement described have provision for tracking three tuned circuits but it should be appreciated that any reasonable number of tuned circuits may be tracked by providing the requisite number of potentiometers.

What we claim is:

1. A tuned circuit arrangement comprising a tuned circuit, a voltage variable capacitor forming part of said tuned circuit and means for applying a voltage to said voltage variable capacitor to effect tuning of the tuned circuit, said means comprising a potential divider for applying a voltage to said voltage variable capacitor, a pair of input terminals arranged to have a tuning voltage applied thereto, and diode means connected between each input terminal and respective ends of the potential divider.

2. An arrangement according to claim 1, in which the voltage variable capacitor comprises a varactor diode.

3. An arrangement according to claim 1, comprising a plurality of tuned circuits and a plurality of parallel connected potential dividers, each potential divider being associated with one of said tuned circuits to effect tracking thereof.

4. An arrangement according to claim 1, in which the diode means comprises a single diode connected between each of the input terminals and the respective ends of the potential divider, with one diode being arranged to be forward biased by means of the applied tuning voltage and the other diode being arranged to be forward biased by means of an external voltage applied via a bleed resistor.

5. A network according to claim 1, in which the diode means comprises two series connected diodes connected between one of the input terminals and one end of the potential divider, and a single diode connected between the other input terminal and the other end of the potential divider, the said two diodes being arranged to be forward biased by means of the applied tuning voltage, and the said single diode being arranged to be forward biased by means of an external voltage applied via a bleed resistor.

6. An arrangement according to claim 1, comprising means in series with the diode means for affording an offset voltage for changing the effective range of the applied tuning voltage.

7. An arrangement according to claim 6, in which the means in series with the diode means comprises a Zener diode.

8. An arrangement according to claim 6 in which the means in series with the diode means comprises a resistance, the offset voltage developed across the said resistance being dependent upon a reference voltage applied via a further resistance to the end of the potential divider to which the diode means is connected.

References Cited

UNITED STATES PATENTS

| | | | |
|---|---|---|---|
| 3,110,004 | 11/1963 | Pope | 334—15 |
| 3,440,544 | 4/1969 | Pampel | 31—36 X |

FOREIGN PATENTS

| | | |
|---|---|---|
| 627,882 | 8/1963 | Belgium. |

PAUL L. GENSLER, Primary Examiner

U.S. Cl. X.R.

307—320; 325—465, 468